(12) United States Patent
Shin

(10) Patent No.: US 7,358,595 B2
(45) Date of Patent: Apr. 15, 2008

(54) METHOD FOR MANUFACTURING MOS TRANSISTOR

(75) Inventor: Eun Jong Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 83 days.

(21) Appl. No.: 11/483,143

(22) Filed: Jul. 7, 2006

(65) Prior Publication Data

US 2007/0007606 A1   Jan. 11, 2007

(30) Foreign Application Priority Data

Jul. 7, 2005  (KR) ...................... 10-2005-0061231

(51) Int. Cl.
*H01L 23/58*  (2006.01)
*H01L 21/302* (2006.01)
*H01L 21/461* (2006.01)

(52) U.S. Cl. ...................... 257/640; 257/649; 257/639; 438/724; 438/744; 438/757; 438/769; 438/791

(58) Field of Classification Search ................ 257/412, 257/288, 239; 438/585, 197, 587, 588
See application file for complete search history.

(56) References Cited

U.S. PATENT DOCUMENTS 6,518,636 B2 *  2/2003  Segawa et al. ............. 257/411
2005/0266632 A1* 12/2005  Chen et al. ................. 438/233
2007/0010073 A1*  1/2007  Chen et al. ................. 438/486

* cited by examiner

*Primary Examiner*—Mark A. Robinson
*Assistant Examiner*—Selim Ahmed
(74) *Attorney, Agent, or Firm*—Andrew D. Fortney

(57) ABSTRACT

Disclosed is a method for fabricating a MOS transistor. The present method includes forming a buffer layer pattern including nitrogen on the semiconductor substrate; forming a gate insulating layer and a gate electrode on the exposed substrate surface; forming a LDD region in the substrate under the buffer pattern; forming a spacer on a top surface of the buffer pattern and sidewalls of the gate electrode; and forming a source/drain region in the substrate under the buffer pattern.

20 Claims, 8 Drawing Sheets

METHOD FOR MANUFACTURING MOS TRANSISTOR

This application claims the benefit of Korean Application No. 10-2005-0061231, filed on Jul. 7, 2005, which is incorporated by reference herein in its entirety.

BACKGROUND OF THE INVENTION

1. Field of the Invention

The present invention relates to a fabrication method for a semiconductor device, and more specifically, to a method for fabricating a MOS transistor.

2. Description of the Related Art

Common use of highly integrated mobile devices results in accelerating the development of a CMOS transistor capable of working at a low power. The method for fabricating such a CMOS transistor may benefit from a process for decreasing leakage current. However, such a process may deteriorate the performance of a CMOS device. To solve this problem, a variety of methods for fabricating a CMOS transistor having both low leakage current and high performance have been developed. Such methods include a Ge-implantation or a strained Si structure, formed by use of a Ge—Si epitaxial film.

FIGS. 1a to 1f show a conventional method for fabricating a CMOS transistor. As shown in the figures, a method for manufacturing an n-type MOS transistor is as follows.

Firstly, $SiO_2$ is deposited as a sacrificial layer for an ion-implantation to form a retro-grade well on a silicon substrate of a semiconductor, which is not shown in the figure. After implanting the ions, the silicon oxide layer is deleted to form a well, a field stop and a channel region.

As shown in FIG. 1a, $SiO_2$ may be deposited as a gate insulating layer 12 on a semiconductor silicon substrate 10 by CVD, then doped Polysilicon is deposited as a conductive layer of a gate electrode 14 by LPCVD. After patterning the conductive layer by photolithography and a dry-etching process such as RIE, etc. using a gate mask, a gate electrode 14, a gate insulating layer 12 under the gate electrode 14 is formed.

After sidewall oxidation of the gate electrode 14, a LDD region 15 is formed on the surface of the silicon substrate exposed by the gate electrode 14 by implanting an n-type dopant, for example P or As in a low concentration.

As shown in FIG. 1b, after depositing a first insulating layer 16 for example, TEOS on an entire surface of the resulting product by LP-CVD, a second layer 18 for example, $Si_3N_4$ is deposited on the first insulating layer 16.

Next, as shown in FIG. 1c, the second insulating layer and the first insulating layer are etched by a dry-etching process such as self-aligned RIE to form spacers 16a and 18a on sidewalls of the gate electrode 14.

Subsequently, as shown FIG. 1d, an n-type dopant for example P or As is implanted in a high concentration using the gate electrode 14 and spacers 16a and 18a as masks to form a source/drain region 20 in the silicon substrate 10 exposed by spacers 16a and 18a.

Next, as shown in FIG. 1e, $Si_3N_4$ as an etch stopping layer 22 is deposited on an entire surface of the result product by LP-CVD, to obtain a low leakage current property instead of applying a silicide process.

Next, as shown in FIG. 1f, after depositing BPSG as an ILD (Interlevel Dielectric) layer on the top of the etch stopping layer 22 by CVD, TEOS/$SiH_4$ as a capping layer, which is not shown in figures, is deposited on the BPSG layer. A contact hole is formed in the capping layer, the ILD layer and the etch-stopping layer 22 to open the source/drain region 20 or the gate electrode 14. After filling the contact hole with a conductive layer such as doped polysilicon or tungsten, the surface of the conductive layer is planarized by CMP to make a contact electrode 24.

In an n-type MOS transistor formed by a conventional fabrication method, high stress in the channel (b) between a LDD region 15 and a source/drain region 20 by punch-through may reduce carrier mobility. As a result, the performance of a CMOS device may decrease.

SUMMARY OF THE INVENTION

It is, therefore, an objection of the present invention to provide a method for fabricating a MOS transistor capable of increasing carrier mobility by reducing the stress in a channel between source/drain regions by adding a buffer layer having high tensile stress on the top surface of a source/drain region and the side surface of a gate electrode.

To achieve the above objects, an embodiment of a method for fabricating a MOS transistor comprises the steps of: (a) depositing a buffer layer including nitrogen on a semiconductor substrate to form a buffer pattern exposing the substrate; (b) forming a gate insulating layer and a gate electrode on the exposed substrate; (c) forming a lightly doped drain (LDD) region in the substrate under the buffer pattern; (d) forming a spacer on a top surface of the buffer pattern and on sidewalls of the gate electrode; (e) forming a source/drain region in the substrate under the buffer pattern.

It is desirable that the buffer pattern of the present invention comprises $Si_3N_4$ or SiON. Preferably, the thickness of the buffer pattern is 500 Å-1500 Å. Also, the buffer pattern has an uppermost surface that is lower than the top surface of the gate electrode. Generally, the buffer layer is deposited by LPCVD or thermal CVD.

The MOS transistor according to the present invention is an n-type or a p-type MOS transistor. Here, the edge of the gate electrode may be higher than the center of the gate electrode.

The present method may further comprise the step of implanting ions into the buffer pattern after forming a source/drain region. It is preferable that the ion implanted into the buffer pattern comprises Ge.

In addition, the present invention provides a MOS transistor comprising (a) a gate insulating layer and a gate electrode on a semiconductor substrate; (b) a buffer pattern including nitrogen on sidewalls of the gate insulating layer and the gate electrode, and on the substrate; (c) a spacer on the buffer pattern and on sidewalls of the gate electrode; and (d) a source/drain region formed in the substrate under the buffer pattern.

DETAILED DESCRIPTION OF THE INVENTION

Reference is made in detail to the embodiments of the present illustrated in the accompanying drawings.

Figure 1A:
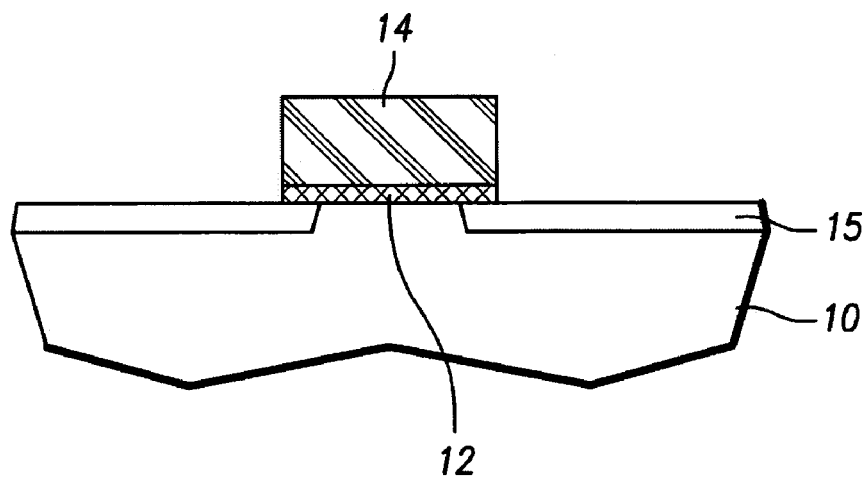
FIGS. 1a to 1f are conventional methods for fabricating a CMOS transistor.
Figure 1B:
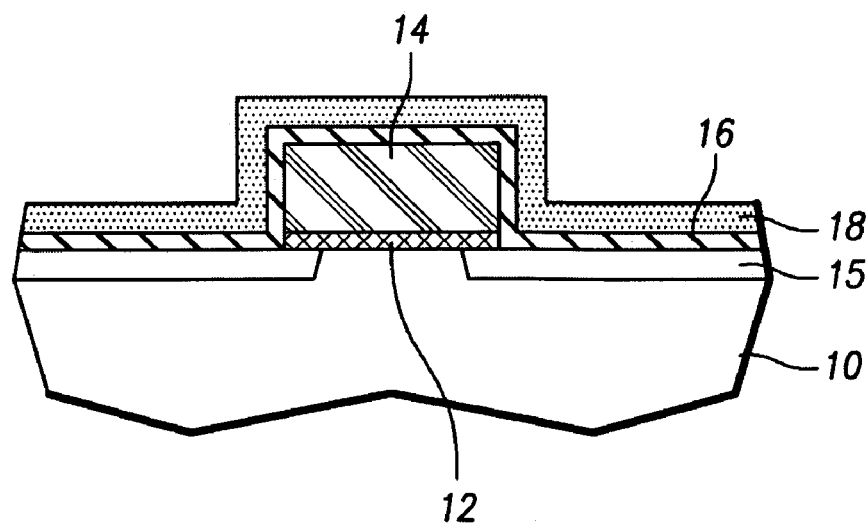
Figure 1C:
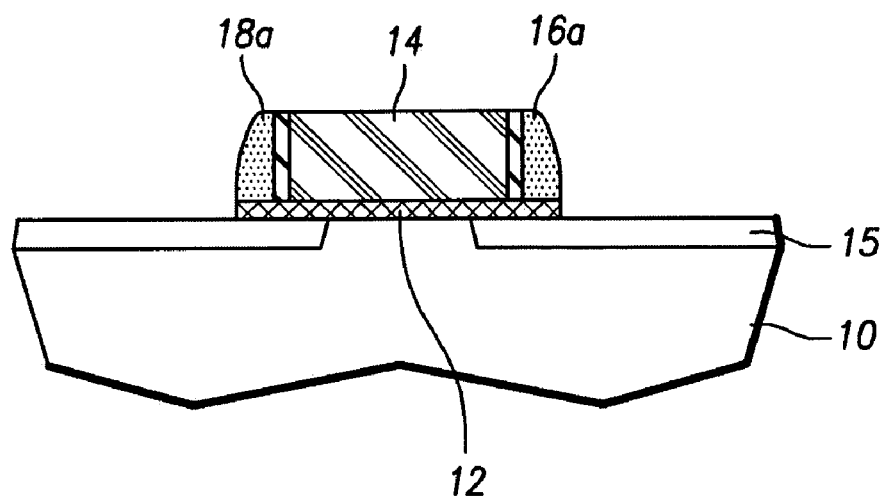
Figure 1D:
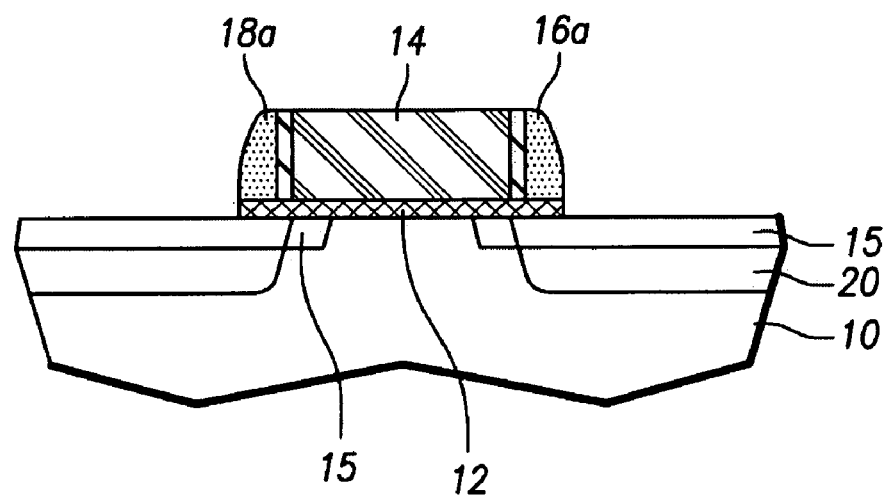
Figure 1E:
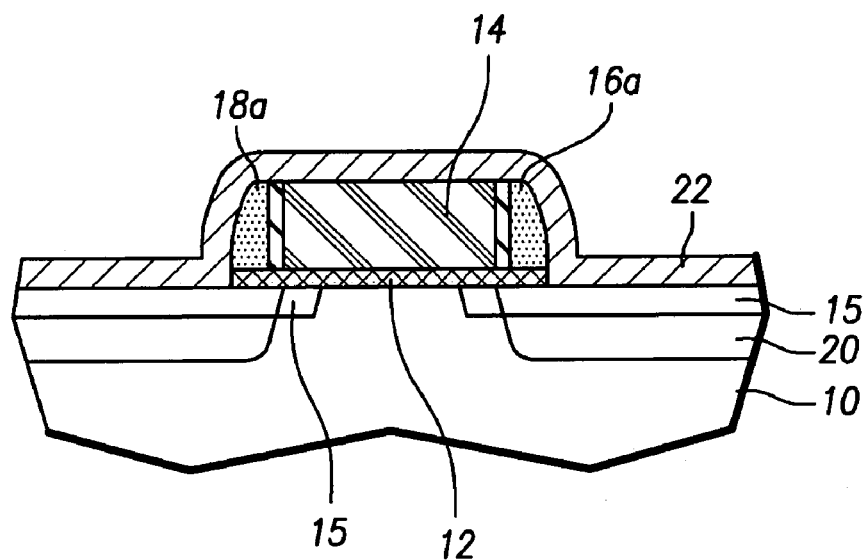
Figure 1F:
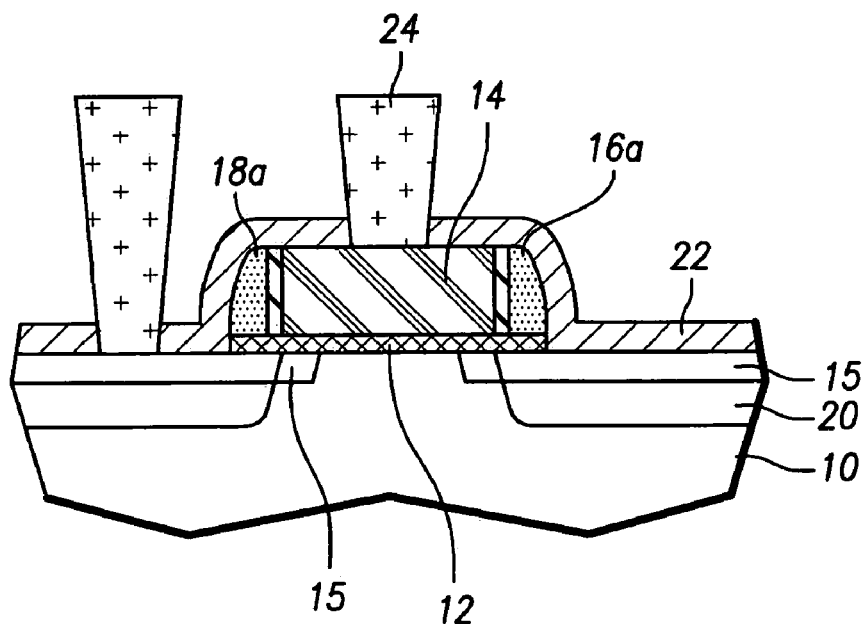
Figure 2A:
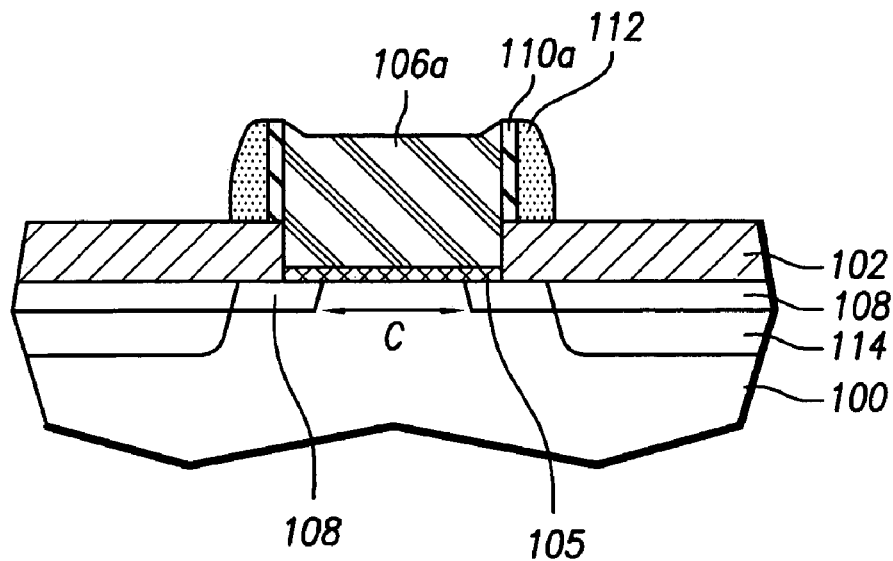
FIGS. 2a and 2b are cross-sectional views illustrating a structure of an n-type MOS and a p-type MOS according to the present invention.

FIG. 2a shows an n-type MOS transistor according to the present invention. A gate insulating layer 105 and a gate electrode 106a are formed in a successive order on a semiconductor substrate 100. A LDD region 108 is formed in the substrate 100 under a buffer pattern 102 and around edges of the gate electrode 106a. The buffer pattern 102, which may have a high tensile stress property, is formed on the substrate, and the LDD region 108 (and/or source/drain region 114) is/are formed below it, and the gate electrode 106a is formed in gaps in buffer pattern 102. Spacers 110a and 112 are formed on a portion of the top surface of the buffer pattern 102 and on the side of the gate electrode 106a. A source/drain region 114 is formed in the silicon substrate 100 under the buffer pattern 102 and around edges of the spacers 110a and 112.

It is preferable that the buffer pattern 102 comprises $Si_3N_4$ or SiON or other material known to have a high tensile stress (e.g., higher than that of silicon dioxide-based dielectric materials, such as CVD or thermal $SiO_2$). Further, the buffer pattern 102 has an uppermost surface that is lower than the top (or uppermost surface) of the gate electrode 106a. Preferably, the thickness of the buffer pattern 102 is 500 Å~1500 Å, or 500 Å~2000 Å less than the thickness of gate electrode 206 (as measured in the center of gate electrode 206).

Therefore, an n-type MOS transistor of the present invention can increase carrier (electron) mobility by reducing the stress permitted in a channel (c) between source/drain regions 114. Adding a buffer pattern 102 having high tensile stress on a top surface of a source/drain region 114 and the side of a gate electrode 106a is believed to reduce the stress or stress differential between source/drain regions 114 and adjacent LDD regions 108. As a result, leakage current of the source/drain regions 114 can be reduced.

Figure 2B:
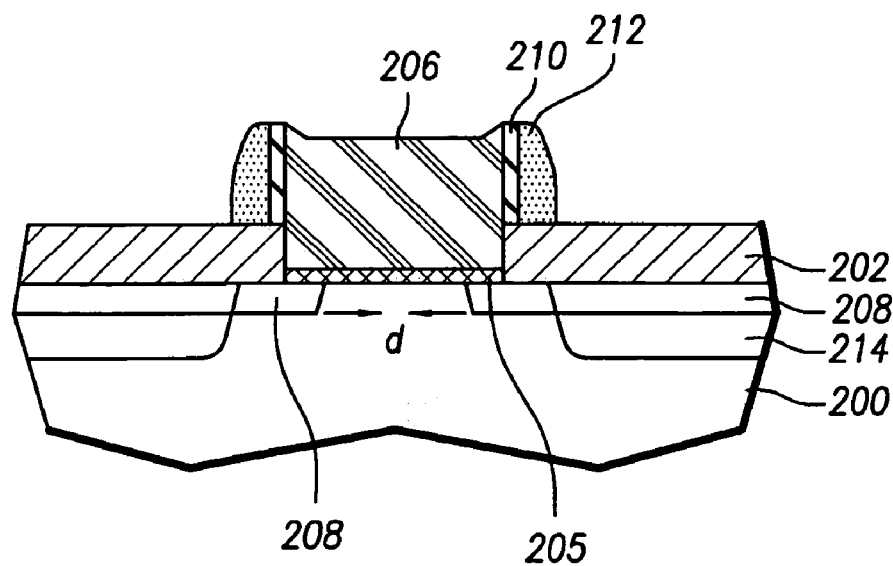

As shown in FIG. 2b, a p-type MOS transistor according to the present invention comprises a gate insulating layer 204 and a gate electrode 206 formed in a successive order on a silicon substrate 200, and a LDD region 208 on the silicon substrate 200 around edges of the gate electrode 206.

A buffer pattern 202 having high tensile stress property is formed on the LDD region 208 and the lower side of the gate electrode 206. Spacer 210 and 212 are formed on sidewalls of the gate electrode 206 and a portion of the top of the buffer pattern 202.

A source/drain region 214 is formed in the silicon substrate 200 around edges of the spacer 210 and 212. Implanting Ge into a channel region (d) under the gate electrode 206 may also reduce stress imparted onto the channel region from the tensile stress of the buffer pattern 202.

The buffer pattern 202 of a p-type MOS device according to the present invention also comprises $Si_3N_4$ or SiON or other material known to have a high tensile stress (e.g., higher than that of conventionally used silicon dioxide-based dielectric materials, such as CVD or thermal $SiO_2$). The buffer pattern 202 has an uppermost surface that is lower than the top (or uppermost surface) of the gate electrode 206. Preferably, the thickness of the buffer pattern 202 is 500 Å~1500 Å, or 500 Å~2000 Å less than the thickness of gate electrode 206 (as measured in the center of gate electrode 206).

As a result, low compressive stress induced from a channel region (d) in the present p-type MOS transistor can increase a carrier mobility and/or reduce leakage current of the source/drain region 214.

FIGS. 3a to 3f illustrate a method for forming an n-type MOS of a CMOS transistor according to an embodiment of the present invention.

Firstly, after depositing a silicon oxide layer ($SiO_2$) as a sacrificial layer for the formation of a retro-grade well by ion implantation, ions are implanted into the well, a field stop, and a channel region, etc., then the silicon oxide layer is removed, but this process is not shown in Figures.

Figure 3A:
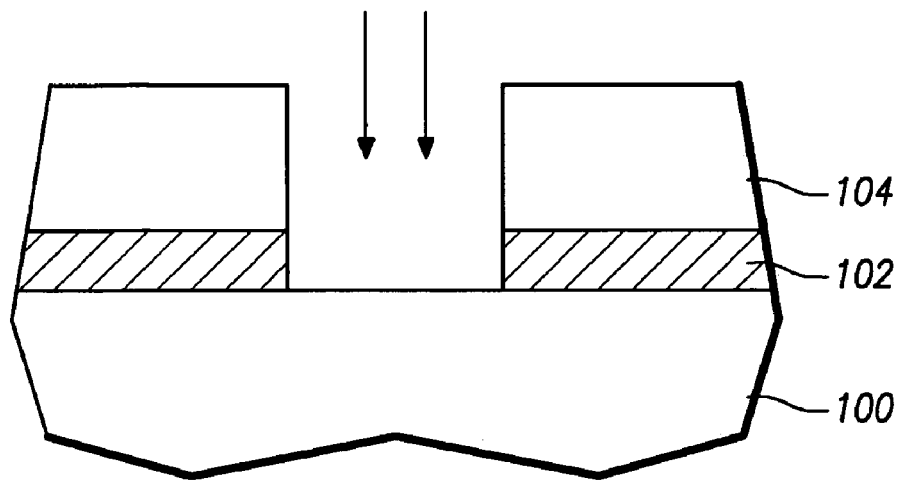
FIGS. 3a to 3g illustrate a method for forming an n-type MOS transistor according to an embodiment of the present invention.

As shown in FIG. 3a, a silicon nitride layer ($Si_3N_4$) as a buffer layer 102 having high tensile stress property is deposited on a silicon substrate 100 by LP-CVD or thermal CVD. For example, a buffer layer 102 ($Si_3N_4$) may be deposited at 700° C.~800°. The stress at a room temperature is about $1.2\times E10$~$1.8\times E10$ dyn/$cm^2$. Therefore, buffer layer 102 ($Si_3N_4$) may have a density of 2.8~3.1 g/$cm^3$, a dielectric constant of 6~7, and/or a stress strength of $\sim 1\times E7$ V/cm.

A $Si_3N_4$ layer deposited by LP-CVD or thermal CVD has a tensile stress of $\sim 1\times E7$ V/cm, which is higher than the typical tensile stress of a $Si_3N_4$ layer deposited by conventional PE-CVD ($\sim 1\times E6$ V/cm).

The buffer layer 102 can also comprise SiON instead of $Si_3N_4$. The buffer layer 102 has an upper surface that is lower than that of the adjacent gate electrode 106a. Preferably, a thickness of the buffer layer is 500 Å~1500 Å.

Next, after applying a photoresist layer by spin-coating, a photoresist pattern 104 is formed by a photolithographic exposure and development process using a inverse gate mask defining a gate region of the MOS transistor.

The buffer layer 102 is etched by dry-etching such as RIE using the photoresist pattern 104 as a mask to open or expose the silicon substrate 100 in the gate electrode area, then the photoresist pattern 104 is removed by ashing. As a result, the buffer pattern 102 is formed on the silicon substrate 100, defining a location where a gate electrode and an edge of a source/drain region will be formed.

Figure 3B:
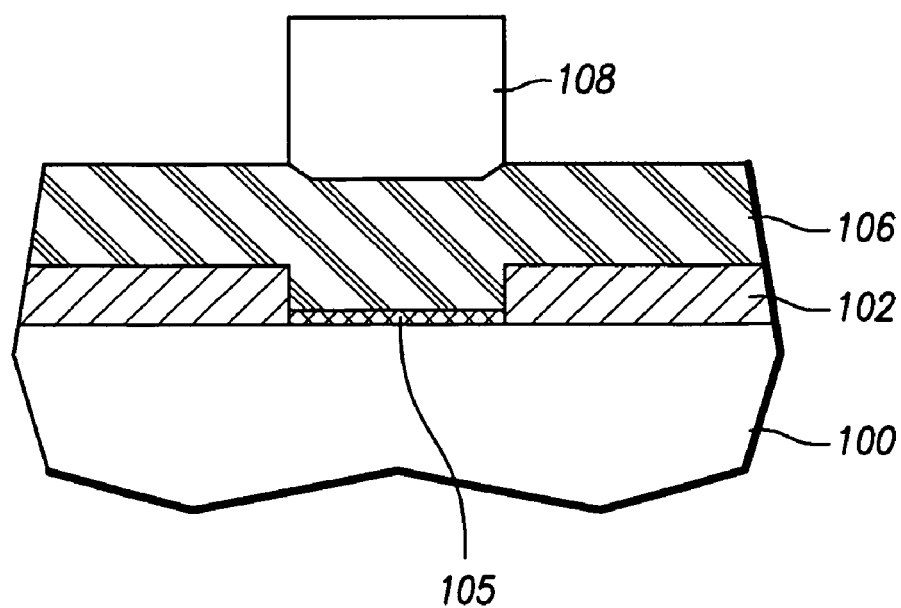

Subsequently, as shown in FIG. 3b, $SiO_2$ as a gate insulating layer 105 is deposited or grown on the silicon substrate 100 exposed by the buffer pattern 102. The gate insulating layer 105 may be deposited by CVD, and it may be grown by conventional wet or dry thermal oxidation. Then, a doped polysilicon layer as a conductive layer 106 for a gate electrode is formed on the buffer pattern 102 by LP-CVD (and optionally by further doping by conventional ion implantation, perhaps during subsequent formation of the source/drain terminals). The conductive layer 106 may have a thickness of 2000 Å-2500 Å. After applying a photoresist layer over the conductive layer 106, a photoresist pattern 108 is formed by photolithography (e.g., exposure and development) to form a gate mask defining a gate region of a MOS transistor. While the photoresist pattern 108 shown has sidewalls that align with sidewalls of the buffer pattern 102 (and thus, the photoresist pattern 108 has a width substantially equal to a gap in buffer pattern 102), it is possible (if not preferable) for the width of photoresist pattern 108 to be slightly larger than the width of the gap in buffer pattern 102 to accommodate for potential alignment errors.

Figure 3C:
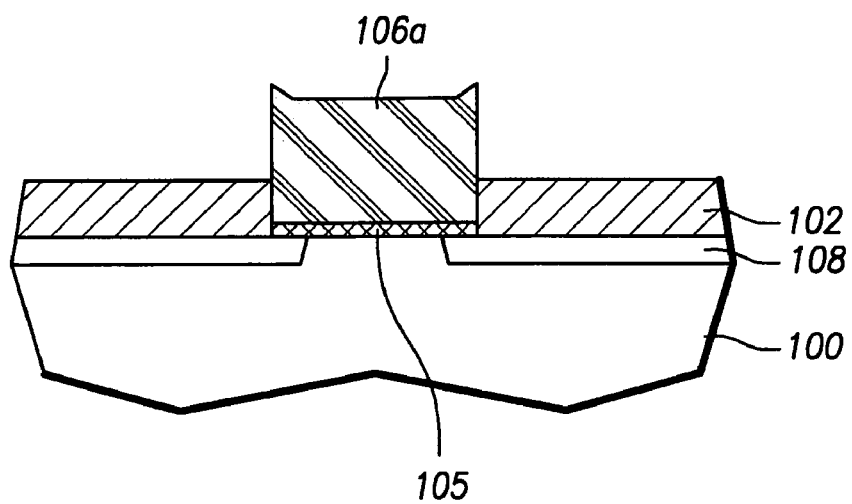

As shown in FIG. 3c, a gate electrode 106a is formed by dry-etching (e.g., reactive ion etching, or RIE) the conductive layer 106 using photoresist pattern 108 as a mask. Here, it is desirable that the etching target is the surface of the buffer layer 102. According to the present embodiment, the edge of gate electrode 106a is higher than the center of gate electrode 106a at the top or upper surface of the gate electrode 106a.

Figure 3D:
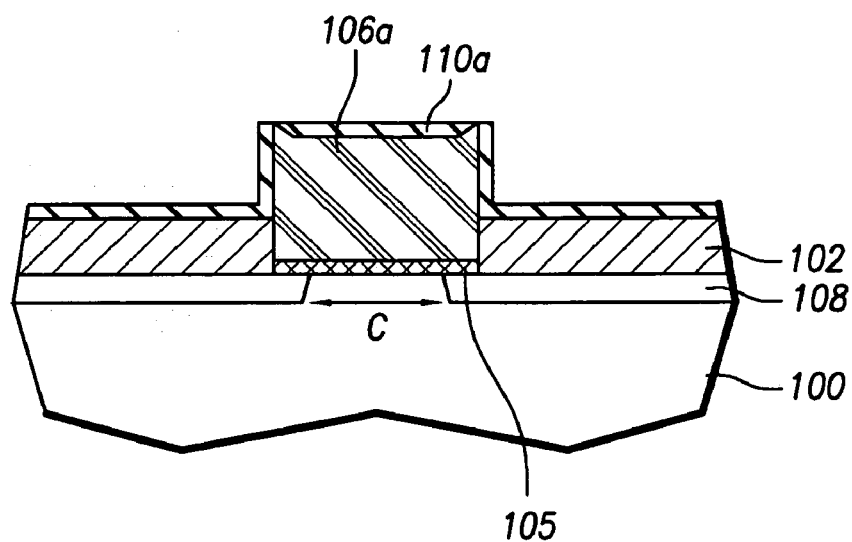

Next, after sidewall oxidation of the gate electrode 106a (not shown), an n-type dopant, for example P or As in a low concentration, is implanted using the gate electrode 106a as a mask to form a LDD region 108 in the silicon substrate 100 under the buffer pattern 102, somewhat aligned with the edge of the gate electrode 106a (see FIG. 3d).

Subsequently, TEOS as a first insulating layer 110 is (conformally) deposited on the side surface of the gate electrode 106a and the top surface of the buffer pattern 102 by LP-CVD. Here, the first insulating layer will be a gate spacer.

Figure 3E:
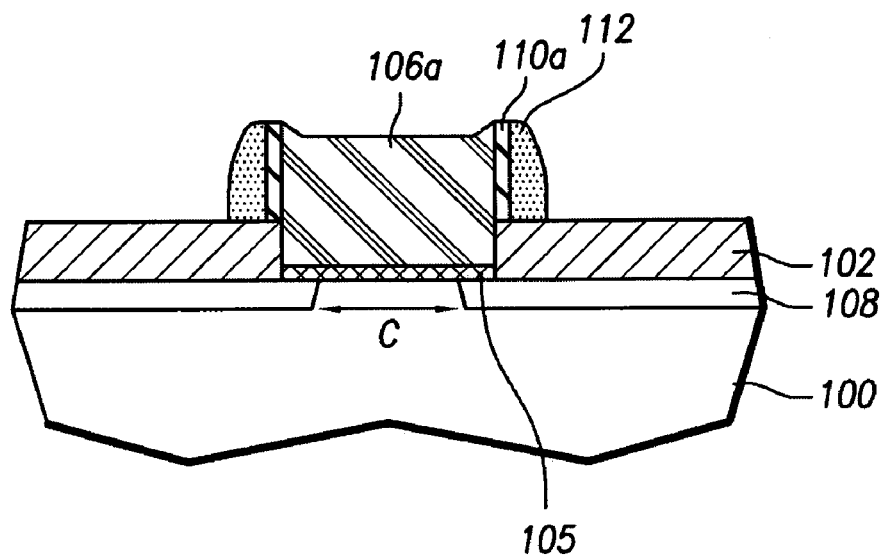

Next, as shown in FIG. 3e, after depositing $Si_3N_4$ as a second insulating layer by LP-CVD, the second insulating layer and the first insulating layer are etched by dry-etching (such as by self-aligned RIE or other anisotropic etching process) to form spacers 110a and 112 on sidewalls of the gate electrode 106a.

Figure 3F:
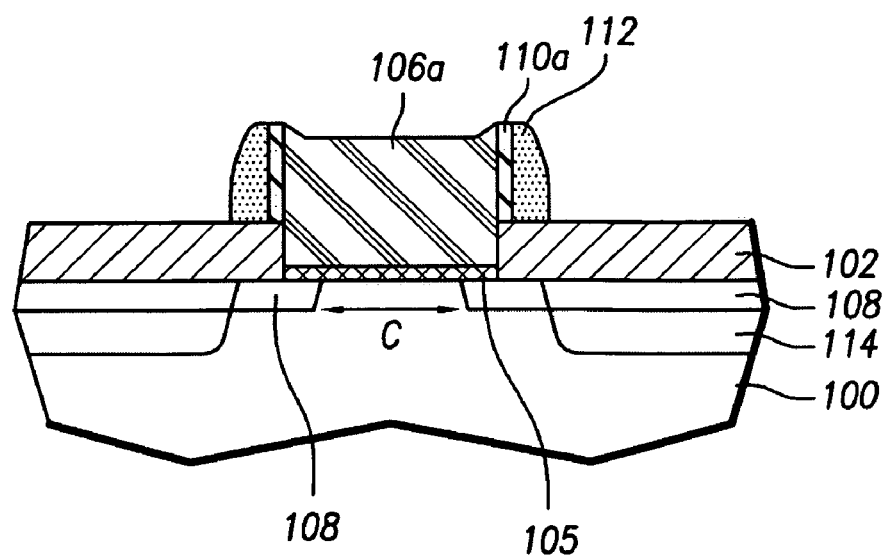
Figure 3G:
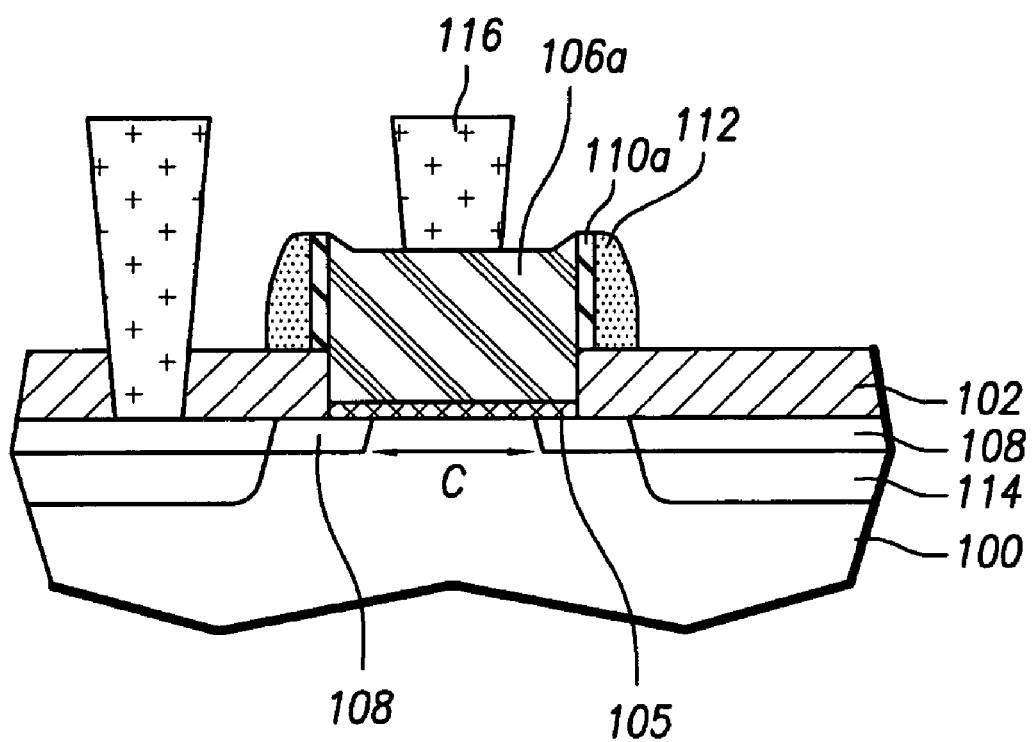

Next, as shown in FIG. 3f, an n-type dopant (for example, P or As) is implanted in a high concentration to form source/drain regions 114 in the silicon substrate 100 under the buffer pattern 102, somewhat aligned with the edge of spacers 110a and 112, using the gate electrode 106a and spacers 110a and 112 as masks.

Next, a doped silicon oxide dielectric (such as a borosilicate glass [BSG], a phosphosilicate glass [PSG], a borophosphosilicate glass [BPSG], or a fluorosilicate glass [FSG]) is deposited over an entire surface of the resulting product by CVD to form, e.g., an interlevel dielectric (ILD) layer. Then, a capping layer such as a TEOS- and/or $SiH_4$-based oxide is deposited on the doped silicate (e.g., BPSG) layer. A contact hole exposing the source/drain region 114 or the gate electrode 106a (or a plurality of contact holes exposing each source/drain region 114 and gate electrode 106a) is/are formed in the capping layer, doped dielectric (ILD) layer and the buffer pattern 102. As shown in 3g, after filling the contact hole with a conductive layer such as doped polysilicon or tungsten (which may further comprise an adhesive and/or buffer layer, such as a Ti/TiN bilayer), the surface of the conductive layer is planarized by CMP to form a contact electrode 116 interconnecting vertically with the source/drain region 114 or the gate electrode 106a.

According to an embodiment method for fabricating an n-type MOS of the present invention, the buffer layer 102 has a high tensile stress property. The silicon substrate 100 has also compressed stress relatively by lattice space difference. As a result, low uniaxial tensile stress is induced at the channel region under the gate electrode 106a to improve the electron mobility at the channel region.

Meanwhile, P-type MOS transistors can be also manufactured by the same procedure. Implanting Ge into the buffer pattern 202 of the source/drain region before or after the ion implantation process of a source/drain region results in reducing the tensile stress property of the buffer pattern 102 of a p-type MOS transistor. Additionally, as shown in FIG. 2B, low compressed stress is induced at the channel region (d) under the gate electrode 206 to improve the hole mobility at the channel region.

The present method for fabricating a MOS transistor can reduce the stress permitted in a channel between source/drain regions by adding a buffer layer having high tensile stress on the top surface of a source/drain region (or a LDD region) and the side surface of a gate electrode before the gate electrode is formed. Therefore, the increased carrier (electron or hole) mobility can improve the performance of a CMOS device.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a MOS transistor, comprising the steps of:
    (a) forming a buffer layer pattern including nitrogen on a semiconductor substrate;
    (b) forming a gate insulating layer and a gate electrode on the substrate surface in a gap in the buffer pattern and in contact with the buffer pattern;
    (c) forming a lightly doped drain (LDD) region in the substrate under the buffer pattern;
    (d) forming a spacer on a top surface of the buffer pattern and in contact with sidewalls of the gate electrode;
    (e) forming a source/drain region in the substrate under the buffer pattern.

2. The method according to claim 1, wherein the buffer pattern comprises $Si_3N_4$ or SiON.

3. The method according to claim 1, wherein the buffer pattern has a thickness of 500 Å~1500 Å.

4. The method according to claim 1, wherein the buffer pattern has an uppermost surface that is lower than a top surface of the gate electrode.

5. The method according to claim 1, further comprising depositing the buffer layer by LPCVD or thermal CVD.

6. The method according to claim 1, wherein the MOS transistor is an n-type MOS transistor.

7. The method according to claim 1, wherein the MOS transistor is a p-type MOS transistor.

8. The method according to claim 1, wherein the gate electrode has an edge that is higher than a center of the gate electrode.

9. The method according to claim 1, further comprising the step of implanting ions into the buffer pattern after forming a source/drain region.

10. The method according to claim 7, further comprising the step of implanting ions into the buffer pattern after forming a source/drain region.

11. The method according to claim 10, wherein the ion implanted into the buffer pattern comprises Ge.

12. A MOS transistor comprising
    (a) a gate insulating layer and a gate electrode on a semiconductor substrate;
    (b) a buffer pattern including nitrogen in contact with sidewalls of the gate insulating layer and the gate electrode, and on the substrate;
    (c) a spacer on the buffer pattern and in contact with sidewalls of the gate electrode;
    (d) a source/drain region in the substrate under the buffer pattern.

13. The MOS transistor according to claim 12, wherein the buffer pattern comprises $Si_3N_4$ or SiON.

14. The MOS transistor according to claim 12, wherein the buffer pattern has a thickness of 500 Å~1500 Å.

15. The MOS transistor according to claim 12, wherein the buffer layer has an uppermost surface that is lower than a top surface of the gate electrode.

16. The MOS transistor according to claim 12, wherein the buffer pattern is deposited by LPCVD or thermal CVD.

17. The MOS transistor according to claim 12, wherein the MOS transistor is an n-type MOS transistor.

18. The MOS transistor according to claim 12, wherein the MOS transistor is a p-type MOS transistor.

19. The MOS transistor according to claim 12, wherein the gate electrode has an edge that is higher than a center of the gate electrode.

20. The MOS transistor according to claim 18, wherein the buffer pattern further comprises Ge.

* * * * *